(12) United States Patent
Kim et al.

(10) Patent No.: US 10,340,419 B2
(45) Date of Patent: Jul. 2, 2019

(54) LIGHT EMITTING DEVICE AND FABRICATING METHOD THEREOF

(71) Applicant: SAMSUNG DISPLAY CO., LTD., Yongin-si, Gyeonggi-do (KR)

(72) Inventors: Dae Hyun Kim, Yongin-si (KR); Jong Hyuk Kang, Yongin-si (KR); Joo Yeol Lee, Yongin-si (KR); Hyun Deok Im, Yongin-si (KR); Chi O Cho, Yongin-si (KR); Hyun Min Cho, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/648,578

(22) Filed: Jul. 13, 2017

(65) Prior Publication Data

US 2018/0019377 A1 Jan. 18, 2018

(30) Foreign Application Priority Data

Jul. 15, 2016 (KR) ........................ 10-2016-0090194

(51) Int. Cl.
*H01L 33/24* (2010.01)
*H01L 27/15* (2006.01)
*H01L 33/00* (2010.01)
*H01L 33/32* (2010.01)
*H01L 33/38* (2010.01)
(Continued)

(52) U.S. Cl.
CPC ............ *H01L 33/24* (2013.01); *H01L 27/156* (2013.01); *H01L 33/007* (2013.01); *H01L 33/0075* (2013.01); *H01L 33/16* (2013.01); *H01L 33/325* (2013.01); *H01L 33/38* (2013.01); *H01L 33/44* (2013.01); *G09G 3/32* (2013.01); *G09G 2300/0452* (2013.01); *G09G 2310/0278* (2013.01); *H01L 25/0753* (2013.01); *H01L 27/1214* (2013.01); *H01L 2933/0016* (2013.01); *H01L 2933/0025* (2013.01)

(58) Field of Classification Search
CPC ..... H01L 33/24; H01L 27/156; H01L 33/007; H01L 33/0075; H01L 33/16; H01L 33/325; H01L 33/38; H01L 33/44
See application file for complete search history.

(56) References Cited

U.S. PATENT DOCUMENTS 8,872,214 B2   10/2014   Negishi et al.
9,112,112 B2   8/2015    Do et al.
(Continued)

FOREIGN PATENT DOCUMENTS

JP   4814394 B2   11/2011
JP   4914929 B2   4/2012
(Continued)

OTHER PUBLICATIONS

Extended European Search Report was issued from the European Patent Office dated Aug. 29, 2017 with respect to the European Patent Application No. 17181535.0.

*Primary Examiner* — Fazli Erdem
(74) *Attorney, Agent, or Firm* — Lee & Morse, P.C.

(57) ABSTRACT

A light emitting device includes first and second electrodes spaced apart from each other on a substrate, at least one bar-type LED having a first end on the first electrode and a second end on the second electrode, and an insulative support body between the substrate and the bar-type LED. The at least one bar-type LED has a length greater than a width.

16 Claims, 16 Drawing Sheets

(51) Int. Cl.
*H01L 33/44* (2010.01)
*H01L 33/16* (2010.01)
*G09G 3/32* (2016.01)
*H01L 27/12* (2006.01)
*H01L 25/075* (2006.01)

(56) References Cited

U.S. PATENT DOCUMENTS

| | | |
|---|---|---|
| 9,287,242 B2 | 3/2016 | Shibata et al. |
| 9,329,433 B2 * | 5/2016 | Negishi ............... H01L 25/0753 |
| 2011/0089850 A1 | 4/2011 | Shibata et al. |
| 2011/0254043 A1 * | 10/2011 | Negishi ................... H01L 33/20 |
| | | 257/99 |
| 2012/0326181 A1 * | 12/2012 | Shibata ............... H01L 25/0753 |
| | | 257/88 |
| 2013/0027623 A1 * | 1/2013 | Negishi ............... H01L 25/0753 |
| | | 349/42 |
| 2016/0148911 A1 * | 5/2016 | Do ...................... H01L 25/0753 |
| | | 257/88 |
| 2016/0211245 A1 | 7/2016 | Do |
| 2017/0192157 A1 * | 7/2017 | Cheng ................... G02B 6/0073 |
| 2017/0338372 A1 * | 11/2017 | Teraguchi ........... H01L 33/0075 |

FOREIGN PATENT DOCUMENTS

| | | |
|---|---|---|
| KR | 10-1244926 | 3/2013 |
| KR | 10-1436123 | 11/2014 |
| KR | 10-1490758 | 2/2015 |
| WO | WO 2016/084671 | 6/2016 |

* cited by examiner

LIGHT EMITTING DEVICE AND FABRICATING METHOD THEREOF

CROSS-REFERENCE TO RELATED APPLICATION

Korean Patent Application No. 10-2016-0090194, filed on Jul. 15, 2016, and entitled, "Light Emitting Device and Fabricating Method Thereof," is incorporated by reference herein in its entirety.

BACKGROUND

1. Field

One or more embodiments described herein relate to a light emitting device and a method for fabricating a light emitting device.

2. Description of the Related Art

Light emitting diodes (LEDs) exhibit relatively satisfactory durability, even in poor environmental conditions, and have excellent performance in terms of lifespan and luminance. One technique for fabricating a micro-bar-type LED on a micro or nano scale involves forming an inorganic crystal structure. This technique involves growing a nitride-based semiconductor.

The small size of bar-type LEDs make them suitable for use in pixels of a self-luminescent display panel. In order to fabricate a pixel using a bar-type LED, the bar-type LED is aligned at a desired position and then mounted so as not to deviate from the position, even during the performance of subsequent processes.

SUMMARY

In accordance with one or more embodiments, a light emitting device is provided. The light emitting device includes a substrate; first and second electrodes spaced apart from each other on the substrate; at least one bar-type LED having a first end on the first electrode and a second end on the second electrode, the at least one bar-type LED having a length greater than a width; and an insulative support body between the substrate and the bar-type LED. The bar-type LED may have a cylindrical shape or polygonal column shape at a micro scale or nano scale. The bar-type LED may include a first conductive semiconductor layer doped with a first conductive dopant, a second conductive semiconductor layer doped with a second conductive dopant and an active layer between the first and second conductive semiconductor layers.

The insulative support body may have a width corresponding to a diameter or width of the bar-type LED. A shortest length of the insulative support body may be substantially equal to the distance between the first and second electrodes. The first electrode, the second electrode, and the insulative support body may be on a same plane on the substrate and have substantially a same height. The insulative support body may include at least one of one or more organic layers or one or more inorganic layers.

The light emitting device may include a plurality of conductive contact layers respectively connecting ends of the bar-type LED to the first and second electrodes. The conductive contact layers may cover ends of the bar-type LED and one end of the first and second electrodes. The first and second electrodes may be spaced apart from each other at a distance less than the length of the bar-type LED. The light emitting device may include a light emitting display panel including a plurality of pixels, wherein each of the pixels includes at least one first electrode and at least one second electrode and wherein at least one bar-type LED is connected between the first and second electrodes.

In accordance with one or more other embodiments, a method for fabricating a light emitting device is provided. The method comprises: forming first and second electrodes to be spaced apart from each other in a light emitting region on a substrate; injecting, into the light emitting region, at least one bar-type LED having a length greater than a width; aligning the bar-type LED on at least one region of the first and second electrodes to be connected between the first and second electrodes; and forming an insulative support body between the substrate and the bar-type LED.

Forming the insulative support body may include forming an insulating layer on the substrate on which the first and second electrodes and the bar-type LED are formed; and allowing the insulating layer between the substrate and the bar-type LED to remain, and removing the insulating layer over the first and second electrodes and the bar-type LED.

Removing the insulating layer over the first and second electrodes and the bar-type LED may include allowing the insulating layer between the substrate and the bar-type LED to remain and removing the insulating layer over the first and second electrodes and the bar-type LED through a photo process using the bar-type LED as a mask.

Removing the insulating layer over the first and second electrodes and the bar-type LED may include allowing the insulating layer between the substrate and the bar-type LED to remain, and removing the insulating layer over the first and second electrodes and the bar-type LED through a front vertical etching process using the bar-type LED as a mask.

Injecting the at least one bar-type LED into the light emitting region may include dropping a solution including the bar-type LED onto the light emitting region. Aligning the bar-type LED may include inducing self-alignment of the bar-type LED by applying a voltage to the first and second electrodes. The method may include respectively forming conductive contact layers on ends of the bar-type LED and first ends of the first and second electrodes. Injecting the at least one bar-type LED into the light emitting region may include dropping, on the light emitting region, a solution in which the bar-type LED and an insulating material are mixed.

Forming the insulative support body between the substrate and the bar-type LED may include allowing the insulating layer between the substrate and the bar-type LED to remain, and removing the insulating layer over the first and second electrodes and the bar-type LED through a photo process or front vertical etching process using the bar-type LED as a mask.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
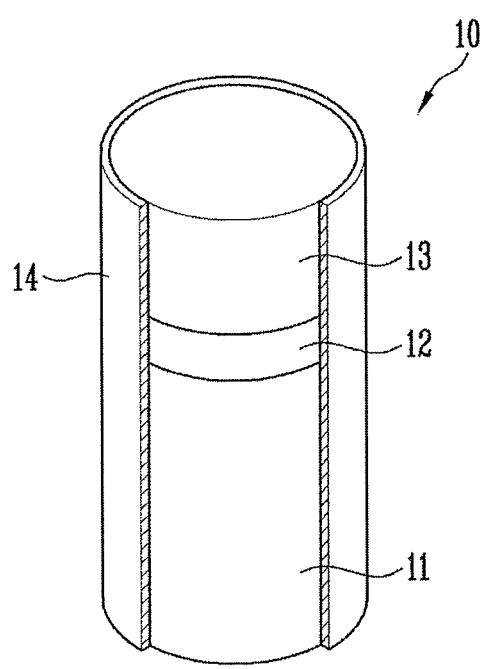
FIG. 1 illustrates an embodiment of a bar-type LED.

Example embodiments will now be described with reference to the accompanying drawings; however, they may be embodied in different forms and should not be construed as limited to the embodiments herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a bar-type LED 10 which includes an active layer 12 between first and second conductive semiconductor layers 11 and 13. For example, the bar-type LED 10 may be implemented as a stack structure in which the first conductive semiconductor layer 11, the active layer 12, and the second conductive semiconductor layer 13 are sequentially stacked.

The bar-type LED 10 in FIG. 1 has a cylindrical shape, but may have a different shape in another embodiment, e.g., various polygonal column shapes including but not limited to a rectangular parallelepiped shape. The bar-type LED 10 may have a rod-like shape or bar-like shape with a long length, e.g., an aspect ratio greater than 1.

In some embodiments, the bar-type LED 10 may further include an insulating film 14. In addition, in some embodiments, the bar-type LED 10 may include first and second electrodes. The first electrode may be electrically connected to the first conductive semiconductor layer 11. The second electrode may be electrically connected to the second conductive semiconductor layer 13. For example, the first electrode may be electrically connected to the bar-type LED 10 through one surface of the first conductive semiconductor layer 11 (in FIG. 1, a lower surface of the bar-type LED 10), which is not covered by the insulating film 14. The second electrode may be electrically connected to the bar-type LED 10 through one surface of the second conductive semiconductor layer 13 (in FIG. 1, an upper surface of the bar-type LED 10), which is not covered by the insulating film 14.

In some embodiments, a conductive contact layer may be between the first electrode and the first conductive semiconductor layer 11 and/or between the second electrode and the second conductive semiconductor layer 13. In some embodiments, the insulating film 14 may allow at least one region of a side surface of the first conductive semiconductor layer 11 and/or a side surface of the second conductive semiconductor layer 13 to be exposed therethrough.

The bar-type LED 10 may be fabricated to have a small size, e.g., a diameter and/or a length in a micro or nano scale range. The size of the bar-type LED 10 may be different in another embodiment. Also, the size and/or structure of the bar-type LED 10 may be changed from that in FIG. 1 to correspond, for example, to conditions or requirements of a light emitting device of a host device.

The first conductive semiconductor layer 11 may include, for example, at least one n-type semiconductor layer. For example, the first conductive semiconductor layer 11 may include at least one of InAlGaN, GaN, AlGaN, InGaN, AlN, or InN, and may include a semiconductor layer doped with a first conductive dopant such as Si, Ge, or Sn. The material of the first conductive semiconductor layer 11 may be different in another embodiment.

The active layer 12 is on the first conductive semiconductor layer 11 and may be formed to have a single- or multiple-quantum well structure. In some embodiments, a clad layer doped with a conductive dopant may be formed over and/or under the active layer 12. For example, the clad layer may be implemented as an AlGaN layer or InAlGaN layer. In one embodiment, a material such as AlGaN or AlInGaN may be used for the active layer 12. If an electric field having a predetermined voltage or more is applied to different ends of the bar-type LED 10, the bar-type LED 10 emits light based on a combination of electron-hole pairs in the active layer 12.

The second conductive semiconductor layer 13 is on the active layer 12, and may include a semiconductor layer of a different type from the first conductive semiconductor layer 11. For example, the second conductive semiconductor layer 13 may include at least on p-type semiconductor layer. For example, the second conductive semiconductor layer 13 may include at least one of InAlGaN, GaN, AlGaN, InGaN, AlN, or InN, and may include a semiconductor layer doped with a second conductive dopant such as Mg. The second conductive semiconductor layer 13 may be made of a different material in another embodiment.

In some embodiments, the bar-type LED 10 may include a phosphor layer, an active layer, a semiconductor layer, and/or an electrode layer formed over and/or under each of the first conductive semiconductor layer 11, the active layer 12, and the second conductive semiconductor layer 13. The bar-type LED 10 may further include insulating film 14. However, in some embodiments, the insulating film 14 may be omitted.

The insulating film 14 surrounds at least one portion of outer circumferential surfaces of the first conductive semiconductor layer 11, the active layer 12, and/or the second conductive semiconductor layer 13. For example, the insulating film 14 may be formed to at least surround the outer circumferential surface of the active layer 12. In some embodiments, the insulating film 14 may include a transparent insulating material. For example, insulating film 14 may include at least one of $SiO_2$, $Si_3N_4$, $Al_2O_3$, or $TiO_2$.

When the insulating film 14 is formed, it is possible to prevent the active layer 12 from being short-circuited with the first electrode and/or the second electrode. Further, when the insulating film 14 is formed, it is possible to reduce or minimize surface defects of the bar-type LED 10, and thus improve lifespan and efficiency. Furthermore, when a plurality of bar-type LEDs 10 are densely arranged, insulating film 14 may prevent an undesired short circuit from occurring between bar-type LEDs 10.

The above-described bar-type LED 10 may be used as a light emitting source for various light emitting devices. For example, the bar-type LED 10 may be used as a light emitting source for lighting devices or self-luminescent display panels.

Figure 2:
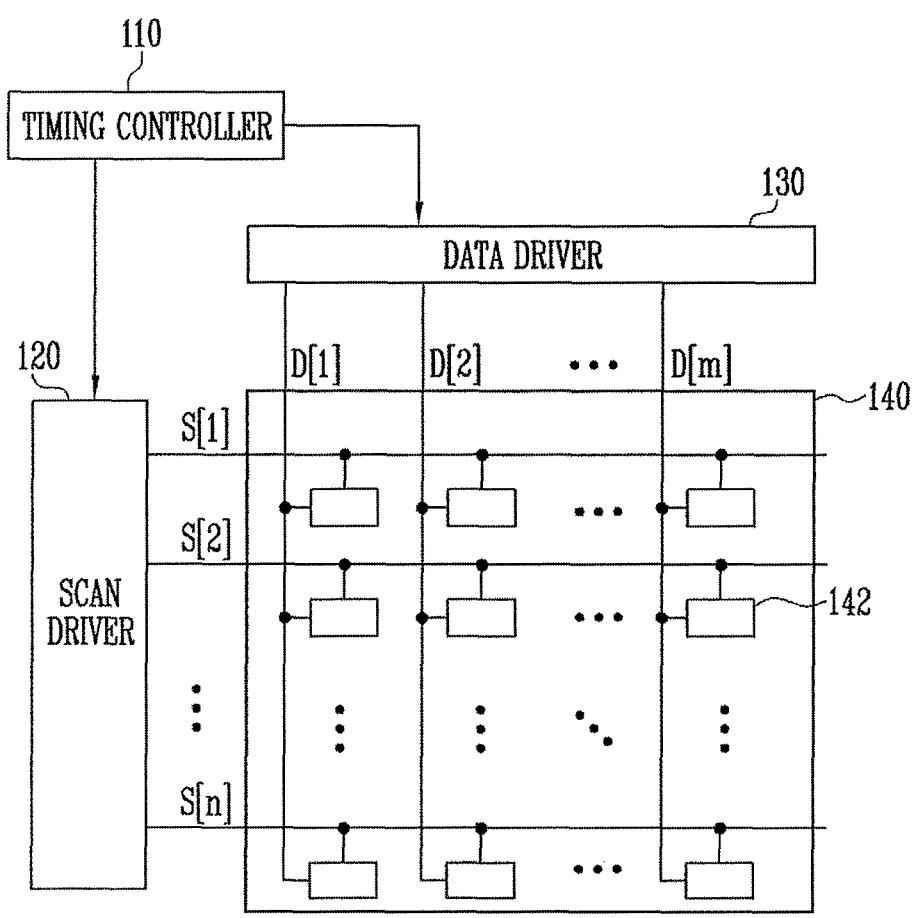
FIG. 2 illustrates an embodiment of a light emitting device.

FIG. 2 illustrates an embodiment of a light emitting device including bar-type LEDs. The light emitting device may include a different type of LED in another embodiment. Also, the light emitting device may be a different type of light emitting device (such as a lighting device) in another embodiment.

Referring to FIG. 2, the light emitting device includes a timing controller 110, a scan driver 120, a data driver 130, and a light emitting display panel 140. In FIG. 2, the light emitting display panel 140 is separate from the timing controller 110, the scan driver 120, and/or the data driver 130. In another embodiment, at least one of the scan driver 120 or the data driver 130 may be integrated with the light emitting display panel 140 in a single body or may be mounted on the light emitting display panel 140.

The timing controller 110 receives various control signals and image data, for driving the light emitting display panel 140, from an outside source (e.g., a system for transmitting image data). The timing controller 110 realigns the received image data and transmits the realigned image data to the data driver 130. Also, the timing controller 110 generates scan control signals and data control signals for driving respective scan and data drivers 120 and 130. The generated scan and data control signals are transmitted to the scan and data drivers 120 and 130, respectively.

The scan driver 120 receives a scan control signal from the timing controller 110 and generates a scan signal corresponding to the scan control signal. The scan signal generated by the scan driver 120 is supplied to unit light emitting regions (e.g., pixels) 142 through scan lines S[1] to S[n].

The data driver 130 receives data control signals and image data from the timing controller 110 and generates data signals corresponding to the data control signals and the image data. The data signals generated by the data driver 130 are output to data lines D[1] to D[m]. The data signals output to the data lines D[1] to D[m] are input to pixels 142 on a horizontal pixel line selected by the scan signal.

The light emitting display panel 140 includes a plurality of pixels 142 connected to the scan lines S[1] to S[n] and the data lines D[1] to D[m]. In this embodiment, each of the pixels 142 may include at least one bar-type LED 10 as shown in FIG. 1. For example, each of the pixels 142 may include at least one first color bar-type LED, at least one second color bar-type LED, and/or at least one third color bar-type LED. The pixels 142 selectively emit light corresponding to data signals from the data lines D[1] to D[m] when a scan signal is supplied from the scan lines S[1] to S[n].

The pixels 142 emit light with luminance that correspond to the input data signals during each frame period. A pixel 142 that receives a data signal corresponding to a black luminance does not emit light during a corresponding frame period, thereby displaying black grayscale value. When the light emitting display panel 140 is an active display panel, the light emitting display panel 140 may be driven by further receiving first and second pixel power source voltages as well as the scan and data signals.

FIGS. 3A-3E illustrate various embodiments of pixel arrangements and structures, which, for example, may be applied to a passive light emitting display panel. For convenience, a jth (j is a natural number) pixel (a first pixel) 142R, a (j+1)th pixel (a second pixel) 142G, and a (j+2)th pixel (a third pixel) 142B on an ith (i is a natural number) horizontal pixel line are illustrated in FIGS. 3A to 3E.

In some embodiments, the first, second, and third pixels 142R, 142G, and 142B may be a red pixel 142R, a green pixel 142G, and a blue pixel 142B which emit light of different colors (e.g., red, green, and blue) and thus constitute one unit pixel. In one embodiment, at least one of the first to third pixels 142R, 142G, or 142B in FIGS. 3A-3E may emit a different color of light, e.g., white. In this case, the light emitting device may include a color filter layer overlapping the light emitting display panel 140 of FIG. 2 or integrally formed with the light emitting display panel 140.

Figure 3A:
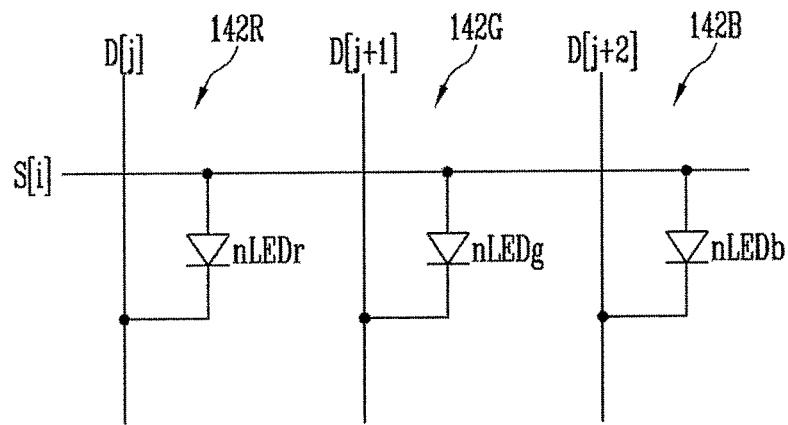
FIGS. 3A-3E illustrate various embodiments of pixels.

Referring to FIG. 3A, each of the first to third pixels 142R, 142G, and 142B may include at least one bar-type LED nLEDr, n LEDg, nLEDb emitting light of a predetermined color. For example, the first pixel 142R may include at least one red bar-type LED nLEDr. The second pixel 142G may include at least one green bar-type LED nLEDg. The third pixel 142B may include at least one blue bar-type LED nLEDb.

In some embodiments, each of the bar-type LEDs nLEDr, nLEDg, and nLEDb may be connected between a corresponding scan line S[i] and a corresponding data line D[j], D[j+1], or D[j+2]. For example, a first electrode (e.g., an anode electrode) of each of the bar-type LEDs nLEDr, nLEDg, and nLEDb may be connected to the corresponding scan line S[i]. A second electrode (e.g., a cathode electrode) of each of the bar-type LEDs nLEDr, nLEDg, and nLEDb may be connected to the corresponding data line D[j], D[j+1], or D[j+2].

When a voltage equal to or greater than a threshold voltage is applied to different ends of each of the bar-type LEDs nLEDr, nLEDg, and nLEDb, each of the bar-type LEDs nLEDr, nLEDg, and nLEDb emits light with a luminance corresponding to the magnitude of the applied voltage. For example, the voltage of a scan signal applied to the scan line S[i] and/or a data signal applied to the data line D[j], D[j+1], or D[j+2] is adjusted to control light emission of each of the pixels 142R, 142G, and 142B.

Figure 3B:
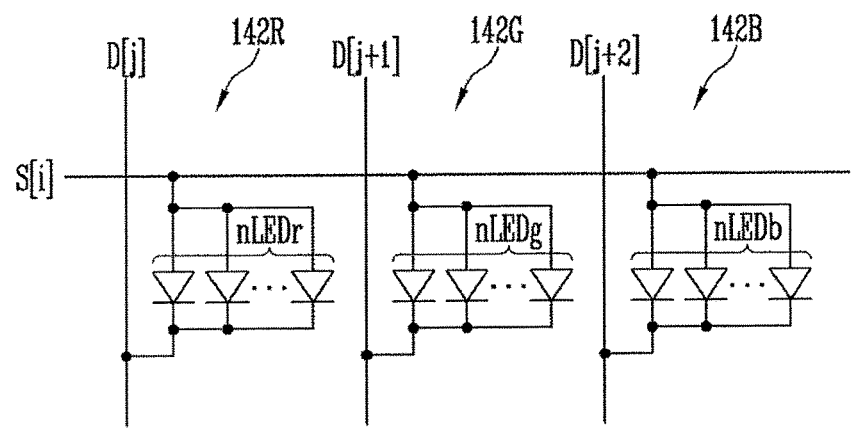

Referring to FIG. 3B, in some embodiments, each of the first to third pixels 142R, 142G, and 142B may include at least two bar-type LEDs nLEDr, nLEDg, and nLEDb connected in parallel. The luminance of each of the first to third pixels 142R, 142G, and 142B may correspond to the sum of brightnesses of a plurality of bar-type LEDs nLEDr, nLEDg, and nLEDb in the corresponding pixel 142R, 142G, or 142B. When each of the first to third pixels 142R, 142G, and 142B includes a plurality of bar-type LEDs nLEDr, nLEDg and nLEDb (e.g., a large number of bar-type LEDs nLEDr, nLEDg, and nLEDb as described above), the defect may be prevented from causing a defect of the pixel 142R, 142G, or 142B, even though a defect occurs in some other bar-type LEDs nLEDr, nLEDg, and nLEDb.

Figure 3C:
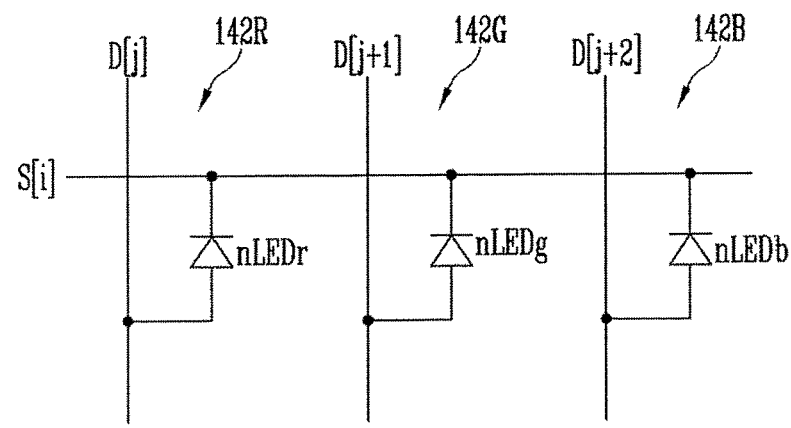

Referring to FIG. 3C, in some embodiments, the connecting direction of the bar-type LEDs nLEDr, nLEDg, and nLEDb in each of the first to third pixels 142R, 142G, and 142B may be different. For example, the first electrode (anode electrode) of each of the bar-type LEDs nLEDr, nLEDg, and nLEDb may be connected to the corresponding data line D[j], D[j+1], or D[j+2]. The second electrode (cathode electrode) may be connected to the corresponding scan line S[i]. The direction of a voltage applied between the corresponding scan line S[i] and the corresponding data line D[j], D[j+1], or D[j+2] in the embodiment of FIG. 3A may be opposite to the direction of a voltage applied between the corresponding scan line S[i] and the corresponding data line D[j], D[j+1], or D[j+2] in the embodiment of FIG. 3C.

Figure 3D:
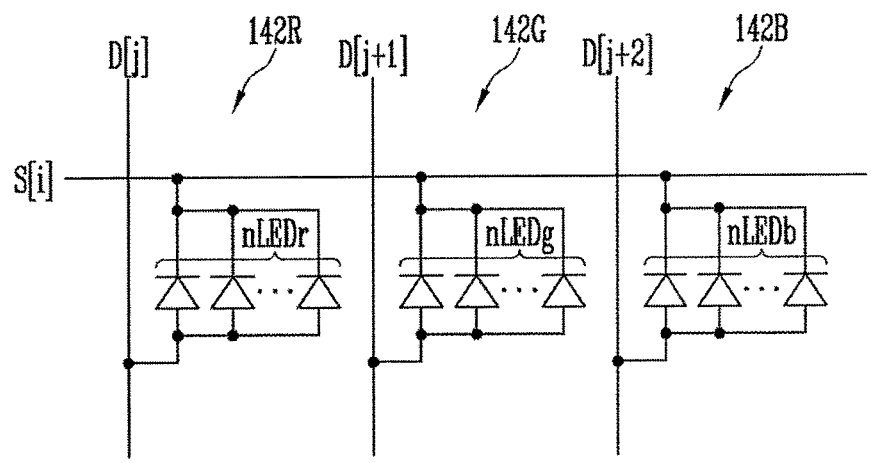

Referring to FIG. 3D, each of the first to third pixels 142R, 142G, and 142B according to the embodiment of FIG. 3C may also include at least two bar-type LEDs nLEDr, nLEDg, or nLEDb connected in parallel.

Figure 3E:
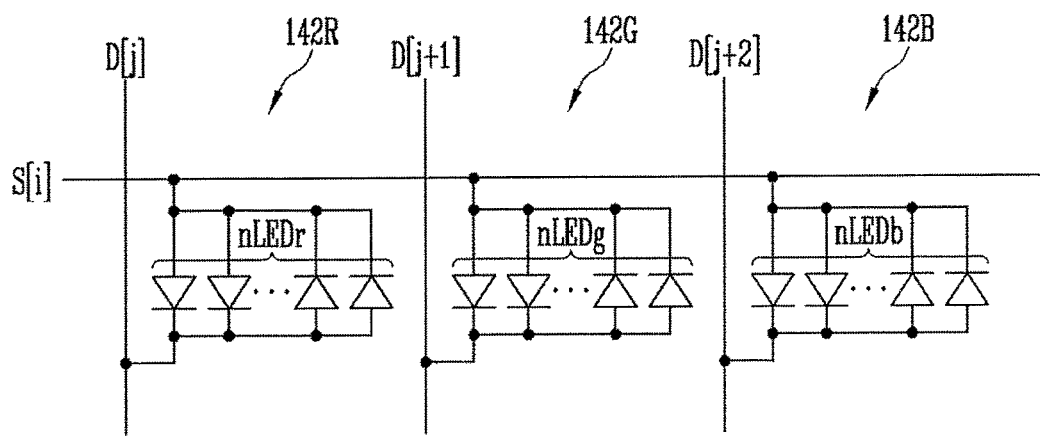

Referring to FIG. 3E, in some embodiments, at least one of the first to third pixels 142R, 142G, and 142B may include a plurality of bar-type LEDs nLEDr, nLEDg, and nLEDb connected in different directions. For example, each of the first to third pixels 142R, 142G, and 142B may include at least one bar-type LED nLEDr, nLEDg, or nLEDb having a first electrode (anode electrode) connected to a corresponding scan line S[i] and a second electrode (cathode electrode) connected to a corresponding data line D[j], D[j+1], or D[j+2], and at least one bar-type LED nLEDr, nLEDg, or nLEDb having a first electrode (anode electrode) connected to the corresponding data line D[j], D[j+1], or D[j+2] and a second electrode (cathode electrode) connected to the corresponding scan line S[i].

In some embodiments, the pixels 142R, 142G, and 142B of FIG. 3E may be DC driven or AC driven. When the pixels 142R, 142G, and 142B of FIG. 3E are DC driven, forward connected bar-type LEDs nLEDr, nLEDg, and nLEDb may emit light and reverse connected bar-type LEDs nLEDr, nLEDg, and nLEDb may not emit light. When the pixels 142R, 142G, and 142B of FIG. 3E are AC driven, the forward connected bar-type LEDs nLEDr, nLEDg, and nLEDb emit light according to the direction of an applied voltage. For example, when the pixels 142R, 142G, and 142B of FIG. 3E is AC driven, the bar-type LEDs nLEDr, nLEDg, and nLEDb in each of the pixels 142R, 142G, and 142B may alternately emit light according to the direction of the applied voltage.

Figure 4A:
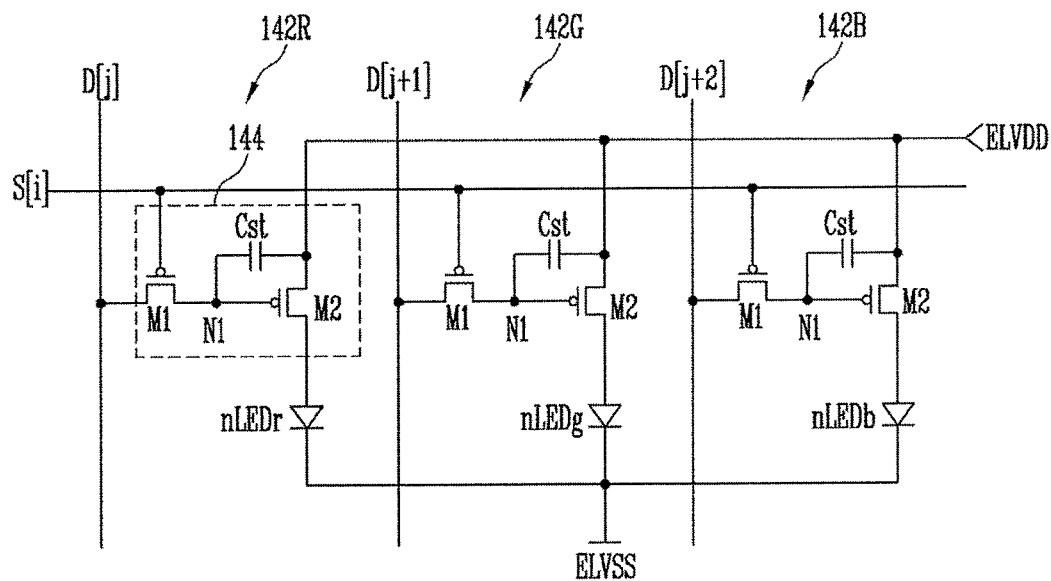
FIGS. 4A-4C illustrate various embodiments of pixels.
Figure 4B:
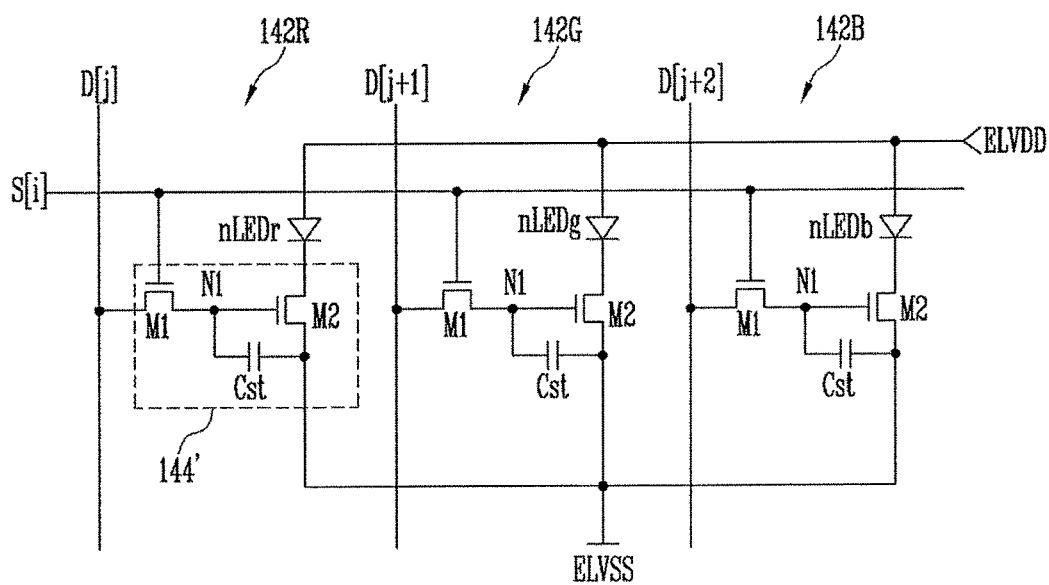
Figure 4C:
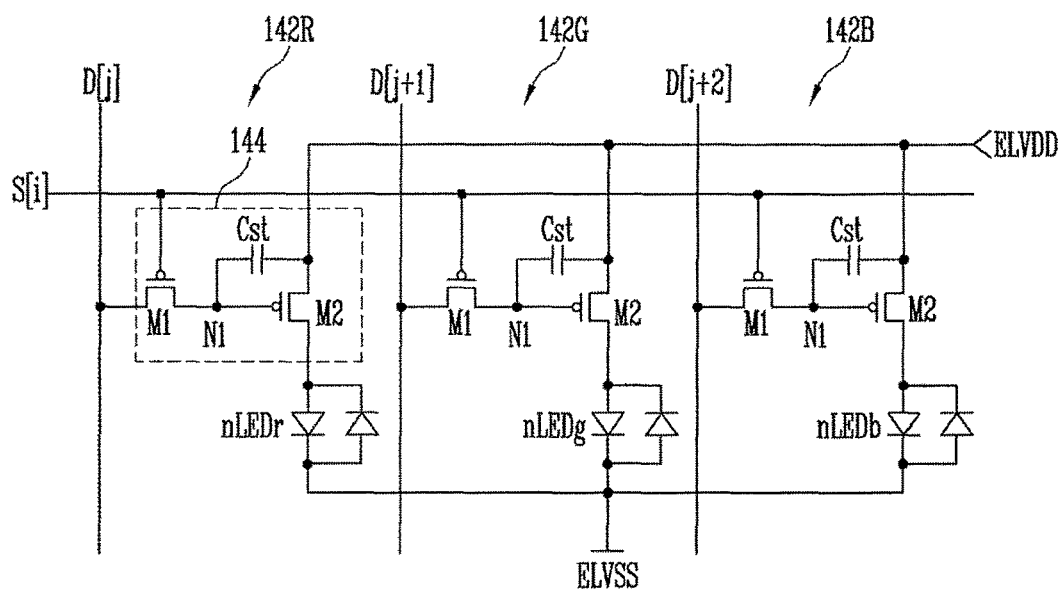

FIGS. 4A-4C illustrate additional embodiments of pixel arrangements and structures, which, for example, may be applied to an active light emitting display panel. Referring to FIG. 4A, each of pixels 142R, 142G, and 142B includes at least one bar-type LED nLEDr, nLEDg, or nLEDb, and a pixel circuit 144 connected thereto. A first electrode (e.g., an anode electrode) of each of the bar-type LEDs nLEDr, nLEDg, and nLEDb is connected to a first pixel power source ELVDD via the pixel circuit 144. A second electrode (e.g., a cathode electrode) of each of the bar-type LEDs nLEDr, nLEDg, and nLEDb is connected to a second pixel power source ELVSS. The first pixel power source ELVDD and the second pixel power source ELVSS may have different potentials. For example, the second pixel power source ELVSS may have a potential lower by a threshold voltage or more of the bar-type LEDs nLEDr, nLEDg, and nLEDb than the first pixel power source ELVDD. Each of the bar-type LEDs nLEDr, nLEDg, and nLEDb emits light with a luminance corresponding to a driving current controlled by a corresponding pixel circuit 144.

An embodiment in which only one bar-type LED nLEDr, nLEDg, or nLEDb is in each of the pixels 142R, 142G, and 142B is illustrated in FIG. 4A. For example, each of the pixels 142R, 142G, and 142B may include a plurality of bar-type LEDs nLEDr, nLEDg, and/or nLEDb connected in parallel.

In some embodiments, each of the pixel circuits 144 may include first and second transistors M1 and M2 and a storage capacitor Cst. A first electrode of the first transistor (switching transistor) M1 is connected to a corresponding data line D[j], D[j+1], or D[j+2]. A second electrode of the first transistor M1 is connected to a first node N1. The structure of the pixel circuits 144 may be different in another embodiment.

The first and second electrodes of the first transistor M1 may be different electrodes. For example, when the first electrode is a source electrode, the second electrode may be a drain electrode. In addition, a gate electrode of the first transistor M1 is connected to a corresponding scan line S[i]. The first transistor M1 is turned on when a scan signal having a voltage (e.g., a low voltage) at which the first transistor M1 can be turned on is supplied from the scan line S[i], to electrically connect the data line D[j], D[j+1], or D[j+2] to the first node N1. At this time, a data signal of a corresponding frame is supplied to the data line D[j], D[j+1], or D[j+2]. Accordingly, the data signal is transmitted to the first node N1. The data signal transmitted to the first node N1 is charged in the storage capacitor Cst.

A first electrode of the second transistor (driving transistor) M2 is connected to the first pixel power source ELVDD. A second electrode of the second transistor M2 is connected to the first electrode of the bar-type LED nLEDr, nLEDg, or nLEDb. In addition, a gate electrode of the second transistor M2 is connected to the first node N1. The second transistor M2 controls the amount of driving current supplied to the bar-type LED nLEDr, nLEDg, or nLEDb, corresponding to a voltage of the first node N1.

The storage capacitor Cst has one electrode connected to the first pixel power source ELVDD and another electrode connected to the first node N1. The storage capacitor Cst charges a voltage corresponding to the data signal supplied to the first node N1 and maintains the charged voltage until a data signal of a next frame is supplied.

In FIG. 4A, each of the pixels 142R, 142G, and 142B have a relatively simple structure including the first transistor M1 for transmitting a data signal inside the pixel 142R, 142G, or 142B, the storage capacitor Cst for storing a voltage based on the data signal, and the second transistor M2 for supplying, to bar-type LED nLEDr, nLEDg, or nLEDb, a driving current corresponding to the data signal. The pixels 142R, 142G, and 142B may have a different structure in another embodiment. In one embodiment, the pixel circuit 144 may include at least one transistor element, e.g., a transistor element for compensating a threshold voltage of the second transistor M2, a transistor element for initializing the first node N1, and/or a transistor element for controlling a light emission time. Each pixel may include other circuit elements, e.g., a boosting capacitor for boosting the voltage of the first node N1.

In addition, all of the transistors (e.g., first and second transistors M1 and M2) in the pixel circuit 144 of FIG. 4A are p-type transistors. In another embodiment, at least one of the transistors M1 and M2 in the pixel circuit 144 may be an n-type transistor.

Referring to NG. 4B, in some embodiments, the first and second transistors M1 and M2 may be n-type transistors. The configuration or operation of a pixel circuit 144' in FIG.

4B may be similar to the pixel circuit 144 in FIG. 4A, except that the connecting positions of some components are different based on transistor type.

Referring to FIG. 4C, in some embodiments, each of the pixels 142R, 142G, and 142B may include a plurality of bar-type LEDs nLEDr, nLEDg, or nLEDb connected in different directions. In this case, the pixels 142R, 142G, and 142B may be DC driven or AC driven.

Figure 5:
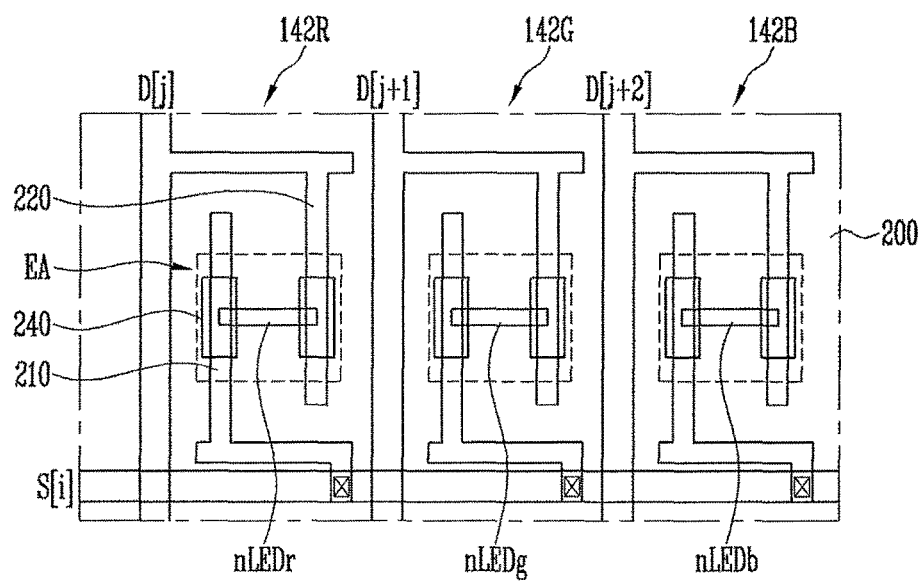
FIG. 5 illustrates an embodiment of a light emitting region.
Figure 6:
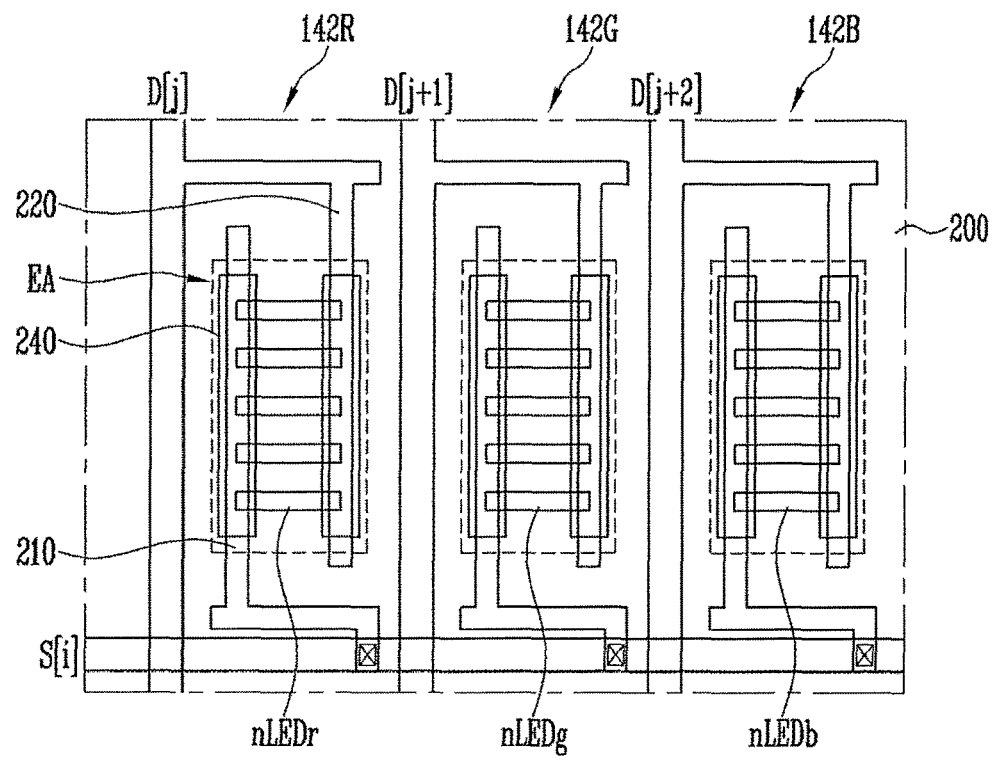
FIG. 6 illustrates another embodiment of a light emitting region.

FIG. 5 illustrates an embodiment of a light emitting region of a light emitting device. FIG. 6 illustrates another embodiment of a light emitting region, which, for example, may be a modification of the device in FIG. 5. These embodiments may applied to a light emitting display panel, a lighting device, or another type of device.

In FIGS. 5 and 6, bar-type LEDs are arranged in the horizontal direction. In another embodiment, at least one bar-type LED may be aligned in an oblique direction between first and second electrodes. In addition, in FIG. 6 a plurality of bar-type LEDs are arranged in parallel, but may be arranged differently in another embodiment.

Referring to FIG. 5, the light emitting device includes at least one light emitting region EA. At least one bar-type LED nLEDr, nLEDg, and/or nLEDb is provided in each light emitting region EA. For example, the light emitting device may be a light emitting display device. In this case, the light emitting device may include a light emitting display panel including a plurality of light emitting regions EA respectively corresponding to pixels 142R, 142G, and 142B.

Each of the pixels 142R, 142G, and 142B includes a light emitting region EA including at least one bar-type LED nLEDr, nLEDg, and/or nLEDb. The number of bar-type LEDs nLEDr, nLEDg, and/or nLEDb in each of the light emitting regions EA may be different in an other embodiment. For example, in FIG. 6, a plurality of bar-type LEDs nLEDr, nLEDg, and/or nLEDb may be in each of the light emitting regions EA.

For example, first and second electrodes 210 and 220 are spaced apart from each other. At least one bar-type LED nLEDr, nLEDg, and/or nLEDb may be electrically connected between the first and second electrodes 210 and 220 in each of the light emitting regions EA. For example, first ends of the bar-type LEDs nLEDr, nLEDg, and/or nLEDb may be on the first electrode 210. Second ends of the bar-type LEDs nLEDr, nLEDg, and/or nLEDb may be on the second electrode 220. In some embodiments, conductive contact layers 240 for stably connecting different ends of the bar-type LEDs nLEDr, nLEDg, and/or nLEDb electrically and/or physically to the first and second electrodes 210 and 220 may be provided on different ends of the bar-type LEDs nLEDr, nLEDg, and/or nLEDb, respectively.

The first electrode 210 is connected to a first electrode line and the second electrode 220 is connected to a second electrode line, to receive a predetermined power source or signal. For example, in a passive light emitting display device, the first electrode 210 may be connected to a corresponding scan line S [i] to receive a scan signal and the second electrode 220 may be connected to a corresponding data line D[j], D[j+1], or D[j+2] to receive a data signal. In an active light emitting display device, at least one of the first or second electrodes 210 and 220 may be connected to the pixel circuit 144 or 144', as illustrated in FIGS. 4A-4C.

In a process of at least aligning bar-type LEDs nLEDr, nLEDg, and nLEDb during a fabricating process of the light emitting device, the first and second electrodes 210 and 220 may be electrically connected to first and second shorting bars, respectively. The first shorting bar may be commonly connected to first electrodes of a plurality of bar-type LEDs nLEDr, nLEDg, and nLEDb. The second shorting bar may be commonly connected to second electrodes of the plurality of bar-type LEDs nLEDr, nLEDg, and nLEDb. However, when the plurality of bar-type LEDs nLEDr, nLEDg, and nLEDb are to be independently driven after the light emitting device is fabricated, the connection between the first and second electrodes 210 and 220 of the plurality of bar-type LEDs nLEDr, nLEDg, and nLEDb and the first and second shorting bars may be cut off. For example, the first and second shorting bars may be formed at the outside of a scribing line of a light emitting display panel, so that the first and second electrodes 210 and 220 may be separated from the first and second shorting bars at the same time when a scribing process is performed.

Figure 7:
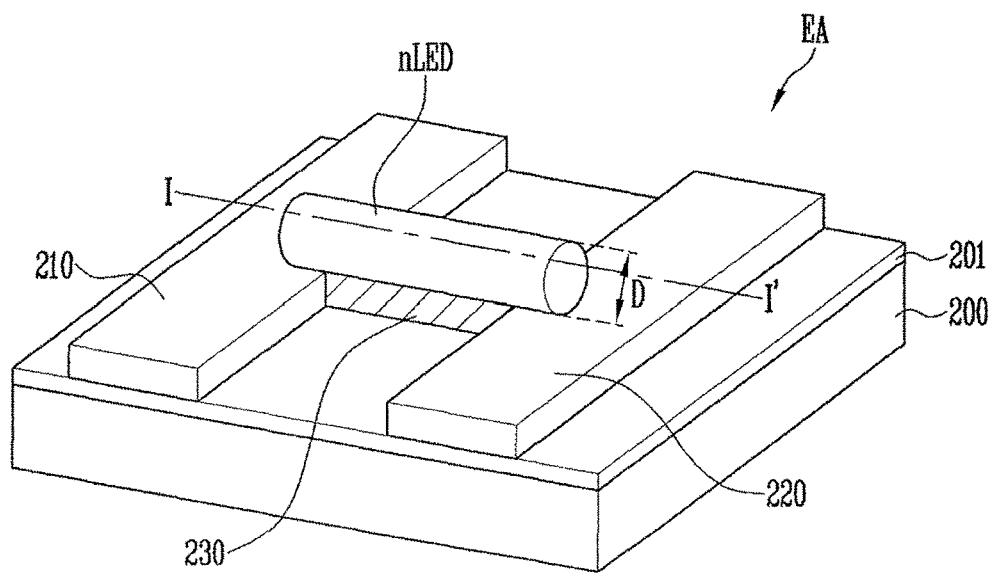
FIG. 7 illustrates a perspective view of the light emitting region in FIG. 5.
Figure 8:
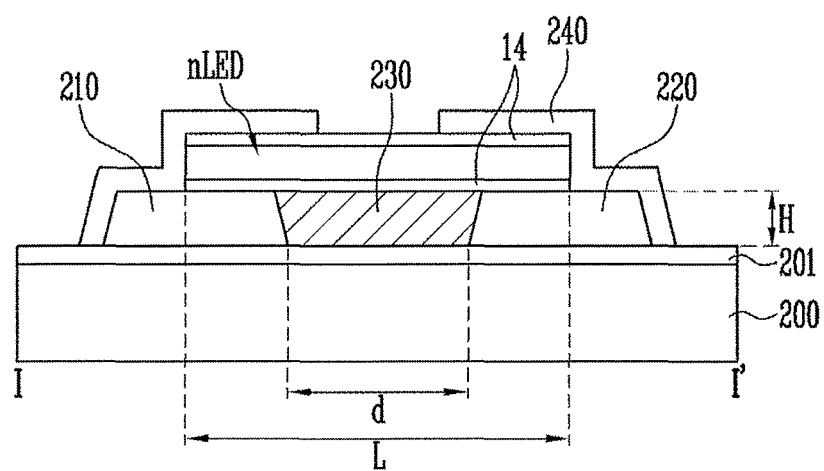
FIG. 8 illustrates a view along section line I-I' in FIG. 7.

FIG. 7 illustrates another embodiment the light emitting region in FIG. 5. FIG. 8 is a view taken along section line I-I' in FIG. 7. In FIG. 7, the illustration of the conductive contact layers is omitted so as to clarify a position relationship between the bar-type LED and the first and second electrodes. In addition, in FIG. 8, the conductive contact layers are illustrated to clarify a connection structure between the bar-type LED and the first and second electrodes. FIGS. 7 and 8 illustrate a partial light emitting region among all light emitting regions of the light emitting device. A plurality of first and second electrodes and a plurality of bar-type LEDs may be provided on a substrate of the light emitting device.

Referring to FIGS. 7 and 8, the light emitting device includes a substrate 200, first and second electrodes 210 and 220 on the substrate 200, and at least one bar-type LED nLED connected between the first and second electrodes 210 and 220. For example, the light emitting device includes an insulative support body 230 between the substrate 200 and the bar-type LED nLED to prevent deviation of bar-type LED nLED.

The substrate 200 may be, for example, an insulating substrate including a transparent material. For example, the substrate 200 may be a flexible substrate including at least one of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), or cellulose acetate propionate (CAP). Also, the substrate 200 may be a rigid substrate including glass or tempered glass. The substrate 200 may be an opaque, semi-opaque, and/or reflective substrate in another embodiment.

In some embodiments, a buffer layer 201 may be on the substrate 200. In other embodiments, the buffer layer 201 may be omitted.

The first and second electrodes 210 and 220 are spaced apart from each other. In some embodiments, the first and second electrodes 210 and 220 may be spaced apart from each other at a distance d shorter than a length L of the bar-type LED nLED. For example, the first and second electrodes 210 and 220 may be spaced apart from each other at the distance d long enough such that different ends of the bar-type LED nLED may be connected between the first and second electrodes 210 and 220, while being stably located on the first and second electrodes 210 and 220, respectively. The first and second electrodes 210 and 220 may be formed of at least one of various conductive electrode materials.

In some embodiments, the first and second electrodes 210 and 220 are on the same plane and may have the same height H. When the first and second electrodes 210 and 220 have the same height H, the bar-type LED nLED may be more stably located on the first and second electrodes 210 and 220.

One end of the bar-type LED nLED is on the first electrode 210. The other end of the bar-type LED nLED is on the second electrode 220. In some embodiments, the bar-type LED nLED may include an insulating film 14 on an outer circumferential surface thereof. The insulating film 14 prevents an active layer of the bar-type LED nLED from being short-circuited with the first electrode 210 and/or the second electrode 220. However, when the insulating film 14 is between the bar-type LED nLED and the first and second electrodes 210 and 220, the electrical connection between the bar-type LED nLED and the first and second electrodes 210 and 220 may be cut off. Therefore, in some embodiments, at least one portion of the insulating film 14 may be removed, and/or conductive contact layers 240 may be additionally formed, to stably connect the bar-type LED nLED to the first and second electrodes 210 and 220.

The conductive contact layers 240 electrically connect different ends of the bar-type LED nLED to the first and second electrodes 210 and 220, respectively. For example, the conductive contact layers 240 may cover upper portions of one end of the bar-type LED nLED and one exposed end of the first electrode 210 and upper portions of the other end of the bar-type LED nLED and one exposed end of the second electrode 220, respectively. For example, side surfaces of the bar-type LED nLED, which are not covered with the insulating film 14, may be electrically connected to the first and second electrodes 210 and 220 through the conductive contact layers 240, respectively.

The conductive contact layers 240 may provide a bonding function not only of electrically connecting the bar-type LED nLED to the first and second electrodes 210 and 220, but also of physically connecting the bar-type LED nLED to the first and second electrodes 210 and 220.

In some embodiments, the conductive contact layer 240 may include a transparent conductive material such as ITO, IZO, or ITZO, so that light emitted from the bar-type LED nLED may be transmitted therethrough. The material constituting the conductive contact layer 240 may be different in another embodiment.

In the embodiment, the insulative support body 230 is under the bar-type LED nLED, e.g., between the substrate 200 and the bar-type LED nLED. For example, the insulative support body 230 may fill in a vertical space between the substrate 200 and the bar-type LED nLED. The insulative support body 230 stably supports the bar-type LED nLED in order to prevent deviation of the bar-type LED nLED aligned between the first and second electrodes 210 and 220. For example, the insulative support body 230 may be formed to prevent the bar-type LED nLED from deviating from the position at which the bar-type LED nLED is aligned between the first and second electrodes 210 and 220.

A process for forming the conductive contact layer 240 for physically and/or electrically connecting the bar-type LED nLED to the first and second electrodes 210 and 220 may be performed after a process of aligning the bar-type LED nLED on the first and second electrodes 210 and 220. In order to prevent separation of a contact material, a cleaning process may be first performed before the conductive contact layer 240 is formed. An ohmic contact between the bar-type LED nLED and the first and second electrodes 210 and 220 may be formed through the cleaning process.

However, when the insulative support body 230 does not exist, an empty space exists between the substrate 200 and the bar-type LED nLED. If the cleaning process is performed in this state, the bar-type LED nLED may easily deviate. Therefore, although a plurality of bar-type LEDs nLED are aligned on the substrate 200, a large number of bar-type LEDs nLED among the plurality of bar-type LEDs nLED may deviate from the positions at which they are aligned. In addition, when the insulative support body 230 does not exist, the deviation of bar-type LEDs nLED may occur during another subsequent process besides the cleaning process. Accordingly, the insulative support body 230 for preventing the deviation of the bar-type LED nLED is previously formed before the cleaning process.

In some embodiments, the insulative support body 230 may be formed using the bar-type LED nLED as a mask, without any additional mask process. The insulative support body 230 may have a shape corresponding to that of the bar-type LED nLED. For example, the insulative support body 230 may have a width corresponding to the diameter D of the bar-type LED nLED. Also, the insulative support body 230 may be on the substrate 200 and disposed on the same plane as the first and second electrodes 210 and 220. Thus, the insulative support body 230 has the same height H as the first and second electrodes 210 and 220. In some embodiments, the insulative support body 230 may have a length corresponding to the spacing distance d between the first and second electrodes 210 and 220. For example, the shortest length of the insulative support body 230 may be the same as the distance d between first and second electrodes 210 and 220.

In some embodiments, the insulative support body 230 may include at least one of one or more organic layers and one or more inorganic layers. For example, the insulative support body 230 may include an organic layer including a positive type photoresist. In one embodiment, the insulative support body 230 may include another organic layer besides the photoresist, or may be configured with an inorganic layer.

According to the embodiment, the insulative support body 230 is between the substrate 200 and the bar-type LED nLED, in order to prevent the bar-type LED nLED from deviating from the position at which the bar-type LED nLED is aligned in a subsequent process, such as a cleaning process. As a result, the yield of the light emitting device may be improved.

Figure 9A:
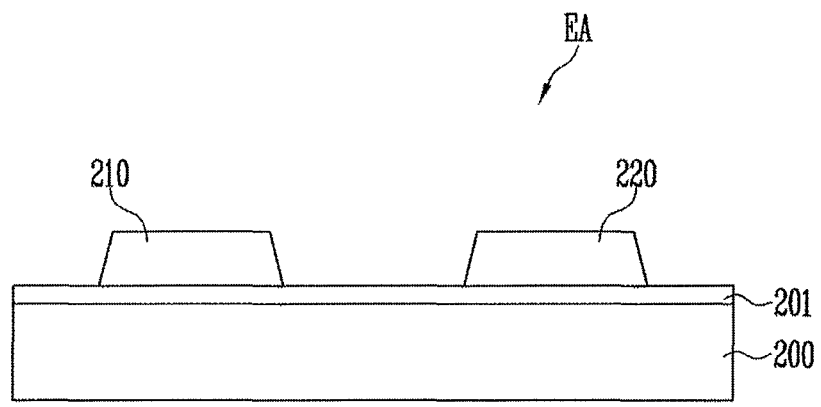
FIGS. 9A-9G illustrate various stages of an embodiment of a method for fabricating a light emitting device.

FIGS. 9A-9G illustrate various stages of another embodiment t of a method for fabricating a light emitting device. Referring to FIG. 9A, a first electrode 210 and a second electrode 220 are formed to be spaced apart from each other in a light emitting region EA on a substrate 200. In some embodiments, a buffer layer 201 may be formed before the first and second electrodes 210 and 220 are formed. In some embodiments, the operation of forming the first and second electrodes 210 and 220 may include forming a conductive layer on the substrate 200 and then patterning the conductive layer, to thereby form the first and second electrodes 210 and 220.

Figure 9B:
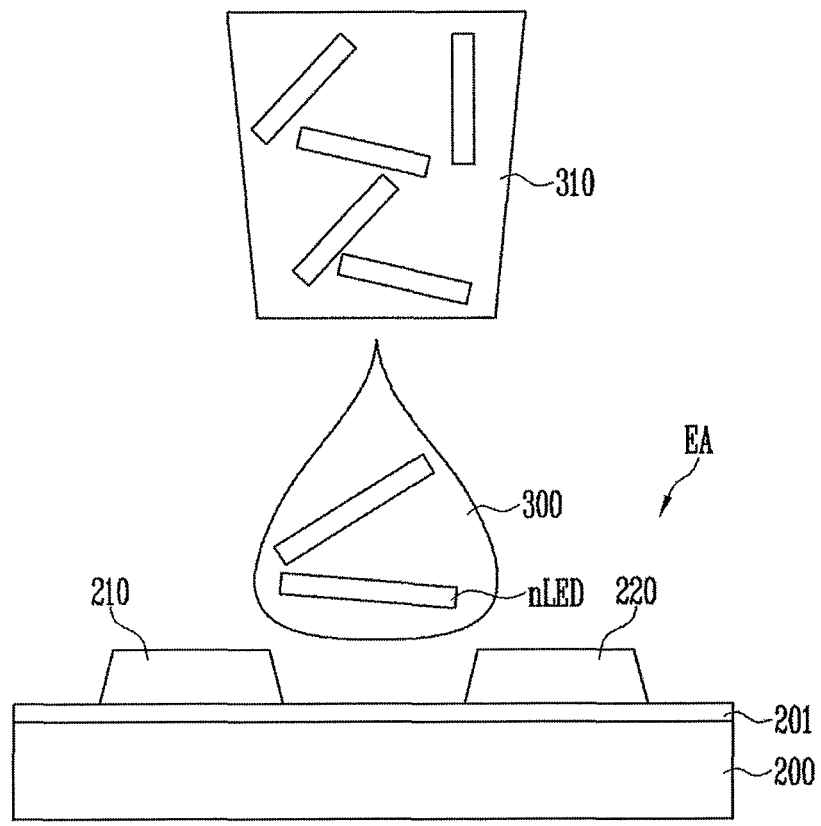

Referring to FIG. 9B, at least one bar-type LED is injected and/or scattered into the light emitting region EA in which the first and second electrodes 210 and 220 are formed. An inkjet printing technique may be used as a non-restrictive example for injecting the bar-type LED nLED onto the first and second electrodes 210 and 220. For example, an outlet (or a nozzle) 310 may be disposed in a corresponding light emitting region EA and a solution 300 including bar-type LEDs nLED may be dropped, thereby injecting and/or scattering the bar-type LED nLED into the light emitting region EA. In some embodiments, the solution 300 may have an ink or paste phase. The technique of injecting the bar-type LED nLED into the light emitting region EA may be different in another embodiment.

In FIG. 9B, sizes or ratios of some components may be illustrated different from actual sizes or ratios for convenience of description. For example, in one embodiment the length of the bar-type LED nLED in the solution 300 may be longer than the distance between the first and second electrodes 210 and 220.

Figure 9C:
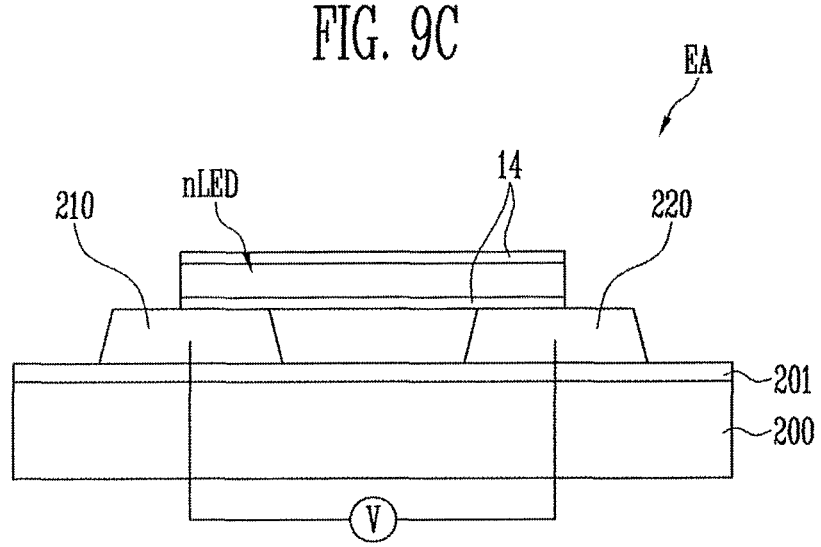

Referring to FIG. 9C, the bar-type LED nLED is aligned to be physically and/or electrically connected between the first and second electrodes 210 and 220. For example, the bar-type LED nLED may be self-aligned on at least one region of the first and second electrodes 210 and 220. In some embodiments, the self-alignment of the bar-type LED nLED may be induced as a DC or AC voltage is applied to the first and second electrodes 210 and 220. For example, when a voltage is applied to the first and second electrodes 210 and 220, dipolarity is induced to the bar-type LED nLED by an electric field between the first and second electrodes 210 and 220. Accordingly, the bar-type LED nLED is self-aligned between the first and second electrodes 210 and 220. The injecting or scattering of the bar-type LEDs and the forming of the electric field may be sequentially or simultaneously performed.

Figure 9D:
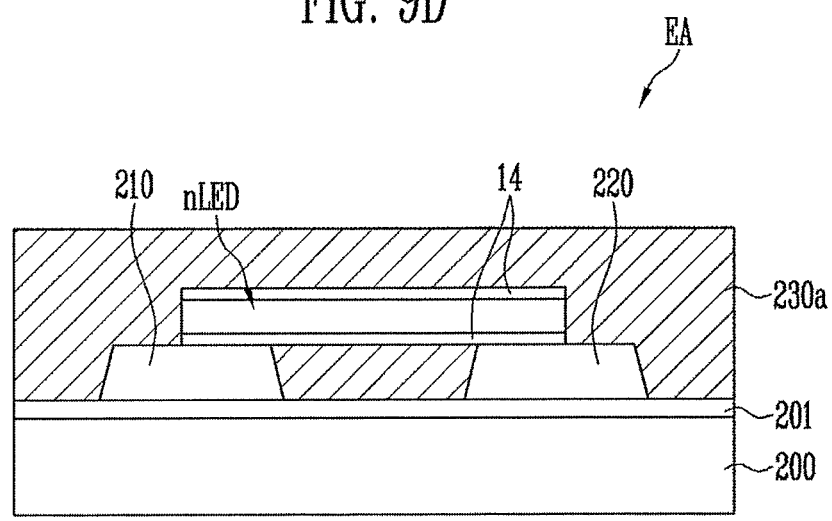

Referring to FIG. 9D, an insulating layer 230a is formed on the light emitting region EA in which the first and second electrodes 210 and 220 and the bar-type LED nLED are formed. The insulating layer 230a may be one or more organic layer and/or one or more inorganic layers. For example, an organic insulating layer 230a may be formed or coated at least on the light emitting region EA.

Figure 9E:
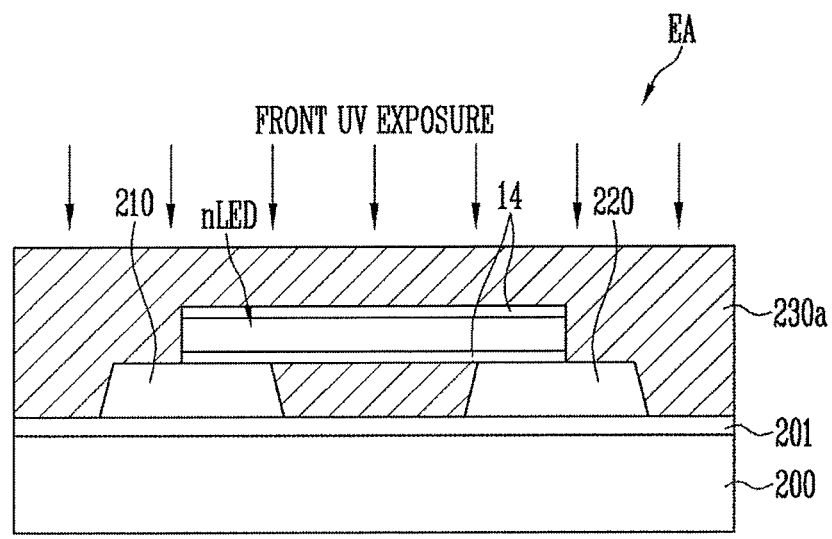

Referring to FIG. 9E, the insulating layer 230a is patterned through a photo process using the bar-type LED nLED as a mask. For example, a front surface (a surface on which the bar-type LED nLED is formed) of the substrate 200, on which the organic insulating layer 230a including a positive type photoresist is formed, may be UV exposed and cured. After this operation, the insulating layer 230a may be patterned such that the insulating layer 230a introduced under the bar-type LED nLED remains and the insulating layer 230a formed over the first and second electrodes 210 and 220 and the bar-type LED nLED is removed.

Figure 9F:
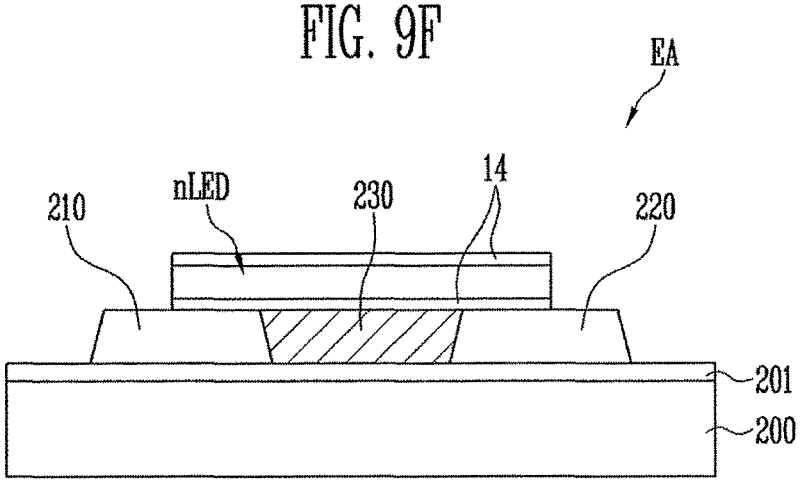

Referring to FIG. 9F, an insulative support body 230 is formed under the bar-type LED nLED (between the substrate 200 and the bar-type LED nLED) by the process of patterning the insulating layer 230a. The insulative support body 230 may prevent deviation of the bar-type LED nLED. In some embodiments, a cleaning process may be additionally performed after the insulative support body 230 is formed.

Figure 9G:
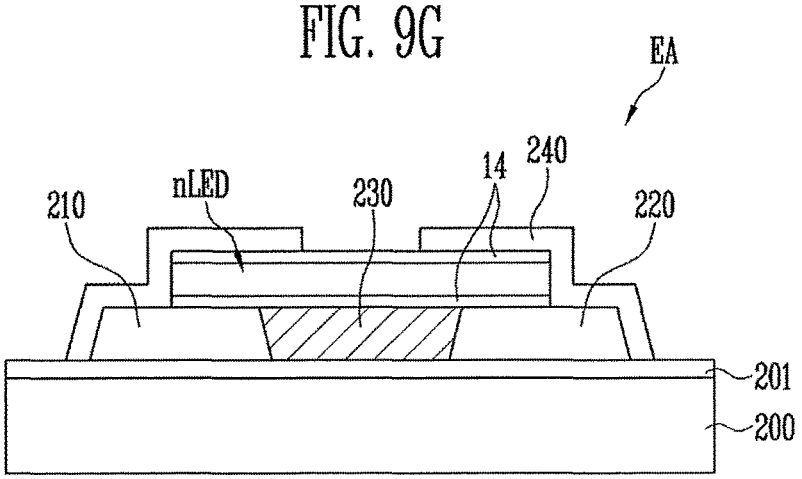

Referring to FIG. 9G, conductive contact layers 240 are formed on different ends of the bar-type LED nLED and first ends of the first and second electrodes 210 and 220 connected thereto, respectively. Accordingly, the bar-type LED nLED and the first and second electrodes 210 and 220 may be electrically connected to each other. Simultaneously, the bar-type LED nLED may be stably coupled physically to the first and second electrodes 210 and 220.

Thus, after the process of aligning the bar-type LED nLED, the insulative support body 230 may be formed under the bar-type LED nLED (between the substrate 200 and the bar-type LED nLED) using the bar-type LED nLED as a mask. Accordingly, the insulative support body 230 may be easily formed without an additional mask process. In addition, since the insulative support body 230 is formed only under the bar-type LED nLED, no issue on exposure resolution in a subsequent process arises.

The insulative support body 230 stably supports the bar-type LED nLED in a subsequent process including the cleaning process. Accordingly, the deviation of the bar-type LED nLED may be prevented.

Figure 10A:
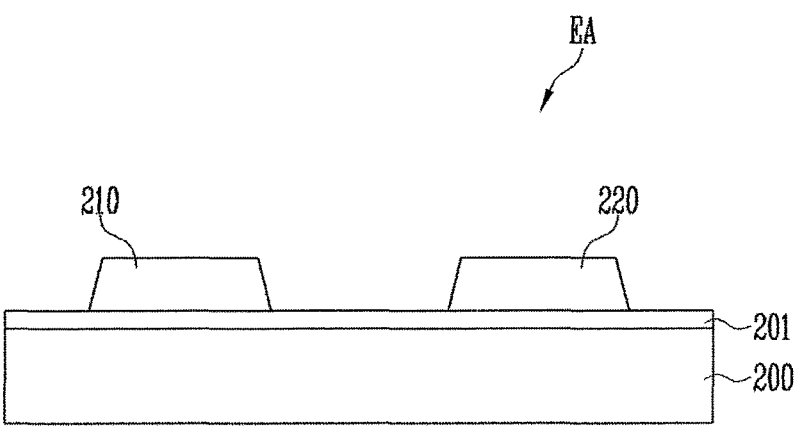
FIGS. 10A-10G illustrate various stages of another embodiment of a method for fabricating method of a light emitting device.
Figure 10B:
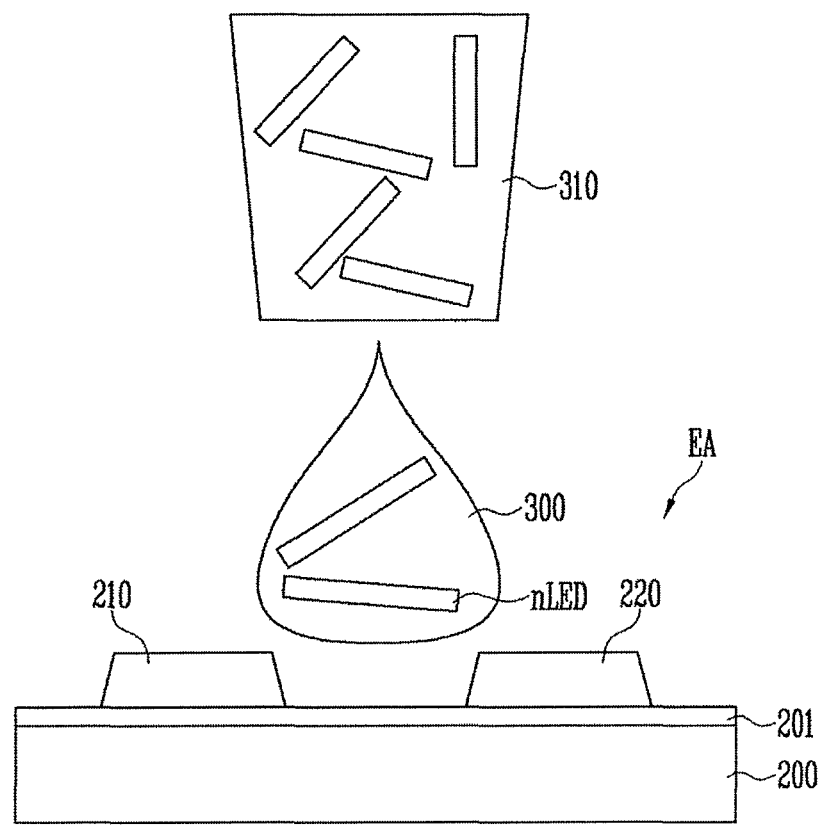
Figure 10C:
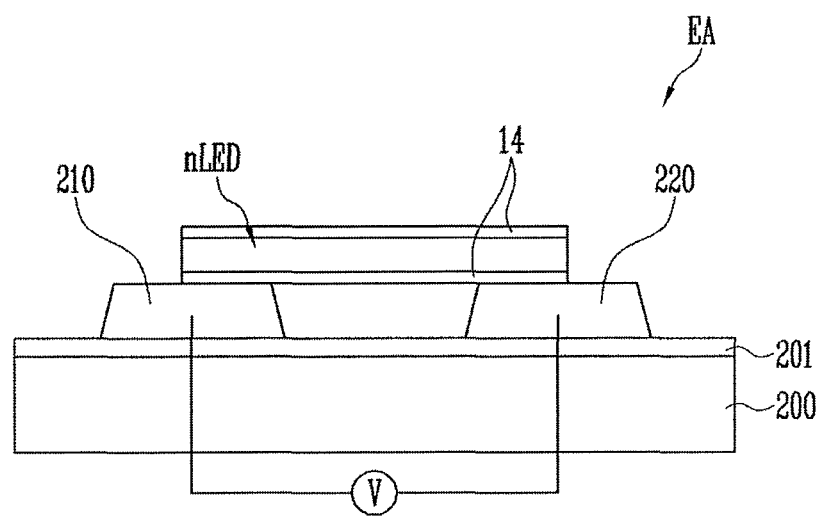
Figure 10D:
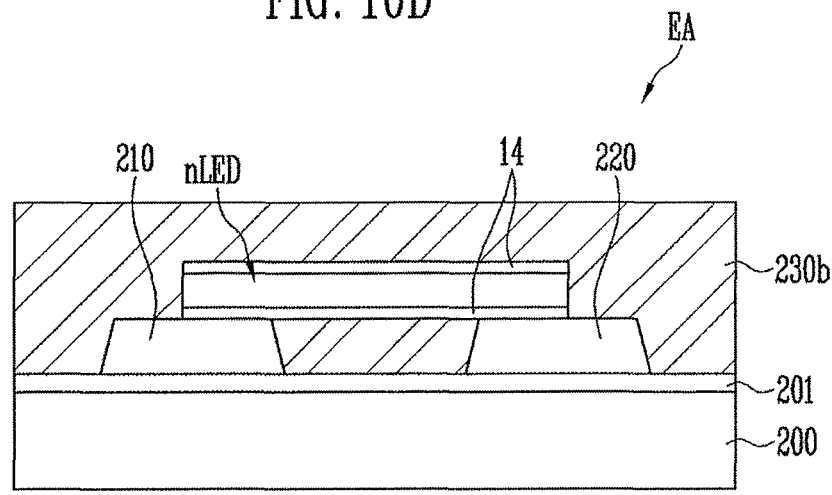
Figure 10E:
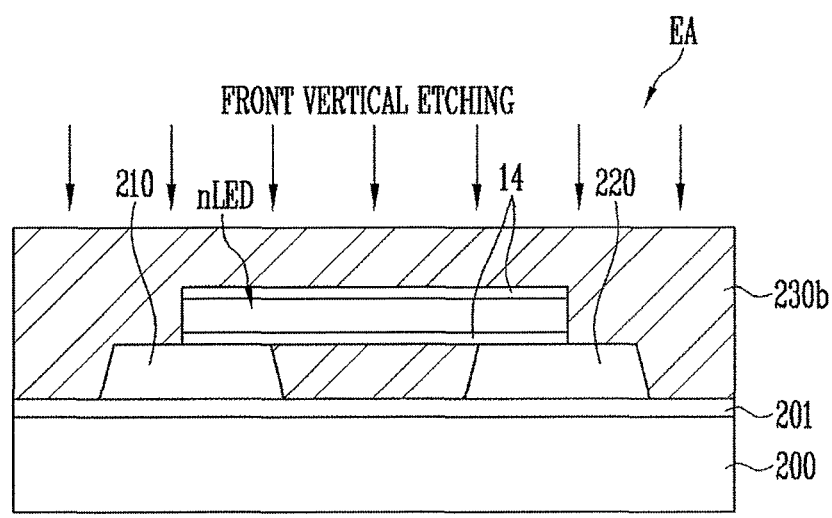
Figure 10F:
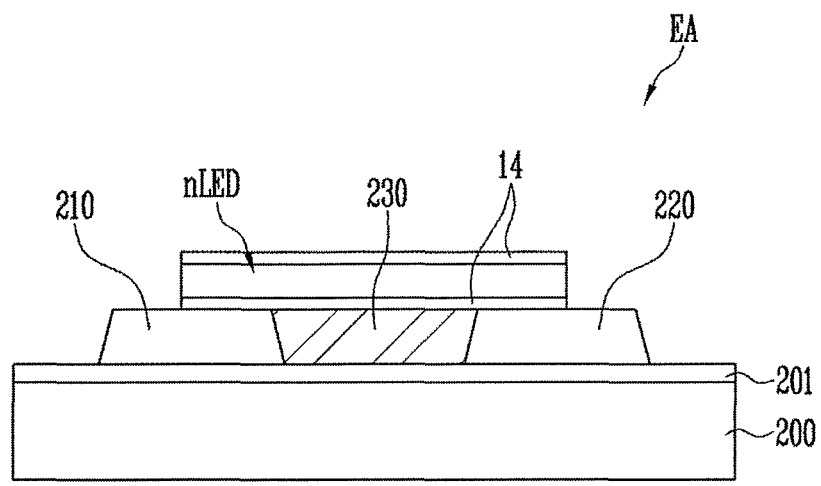
Figure 10G:
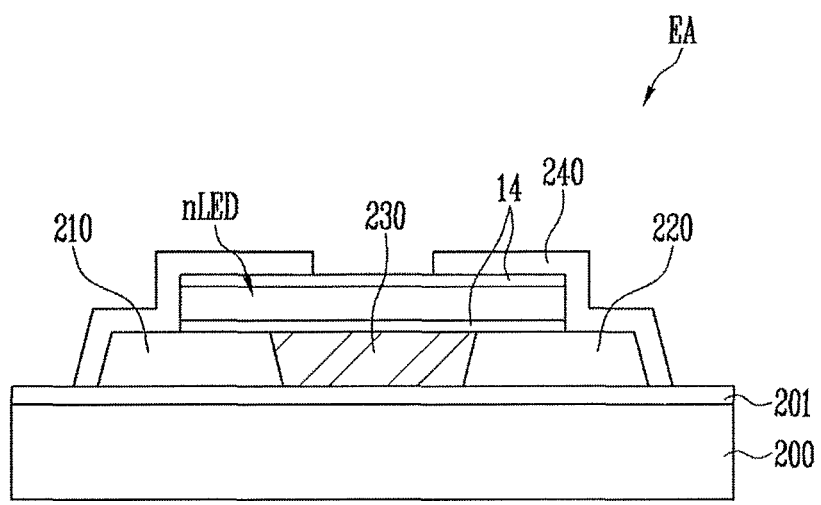

FIGS. 10A-10G illustrate various stages in another embodiment of a method for fabricating a light emitting device. Referring to FIGS. 10A to 10G, this method includes forming first and second electrodes 210 and 220 in a light emitting region EA on a substrate 200 (FIG. 10A), injecting and/or scattering at least one bar-type LED nLED into the light emitting region EA in which the first and second electrodes 210 and 220 are formed (FIG. 10B), aligning the bar-type LED nLED (FIG. 10C), forming an insulating layer 230b at least in the light emitting region EA on the substrate 200 on which the bar-type LED nLED is formed (FIG. 10D), forming an insulative support body 230 through an etching process for allowing only the insulating layer 230b to remain under the bar-type LED nLED (FIGS. 10E and 10F), and respectively forming conductive contact layers 240 on different ends of the bar-type LED nLED (FIG. 10G).

In this embodiment, the insulating layer 230b may include one or more organic layers and/or one or more inorganic layers. In addition, forming the insulative support body 230 by patterning the insulating layer 230b may include allowing the insulating layer 230b under the bar-type LED nLED remain and removing the insulating layer 230b over the first and second electrodes 210 and 220 and the bar-type LED nLED through a front vertical etching process using the bar-type LED nLED as a mask. The front vertical etching process may be, for example, a dry etching process using an etching gas.

Figure 11A:
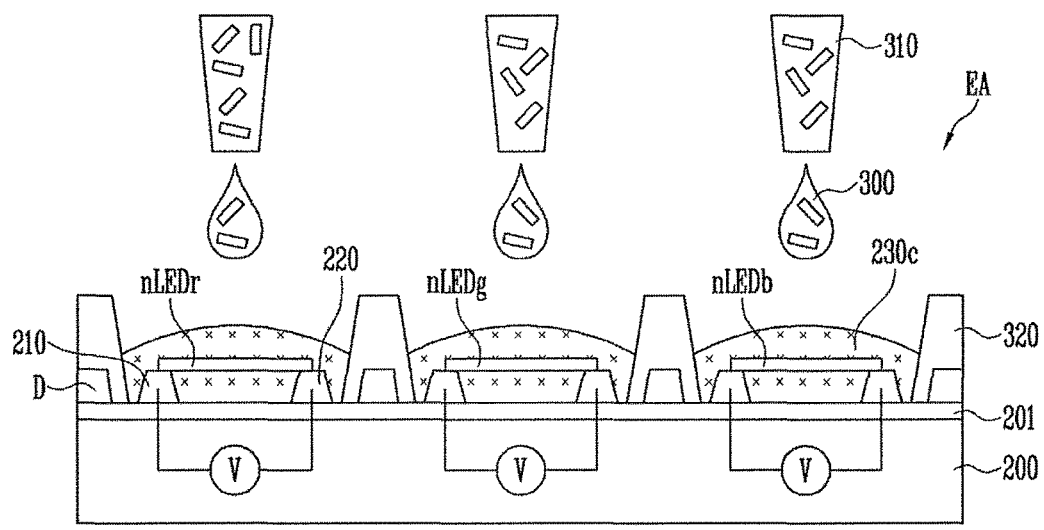
FIGS. 11A-11B illustrate stages in another embodiment of a method for fabricating a light emitting device.
Figure 11B:
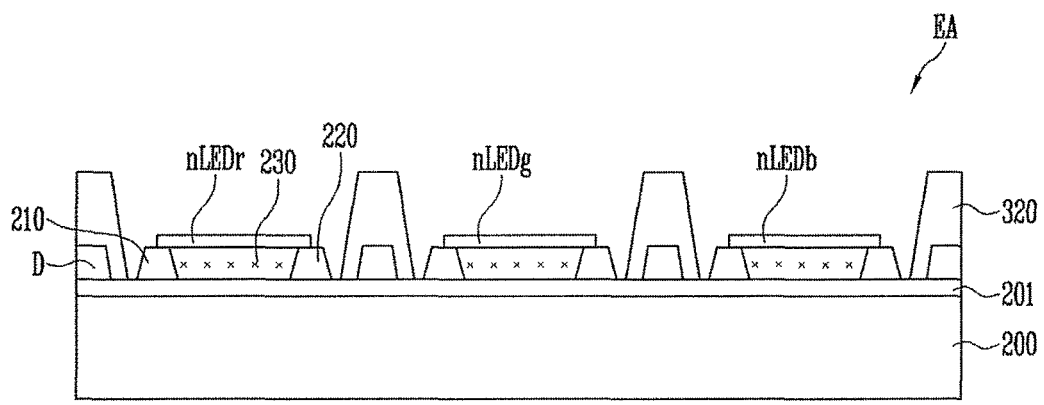

FIGS. 11A and 11B illustrate various stages in another embodiment of a method for fabricating a light emitting device. FIGS. 11A and 11B illustrate a light emitting display panel in the light emitting device. Particularly, FIGS. 11A and 11B illustrate an operation of forming bar-type LEDs and an insulative support body in each of unit pixel regions of a light emitting region of the light emitting display panel.

Referring to FIG. 11A, the method uses an outlet (or a nozzle) 310 having a solution 300 contained therein. The solution includes bar-type LEDs nLEDr, nLEDg, or nLEDb corresponding to a color of a corresponding pixel in each of pixel regions defined by a pixel defining layer 320. In some embodiments, the pixel defining layer 320 may at least partially overlap a data line D.

In FIG. 11A, sizes or ratios of some components may be different from actual sizes or ratios used. For example, the bar-type LEDs nLEDr, nLEDg, and nLEDb in the solution 300 may have sizes substantially equal or similar to those of bar-type LEDs nLEDr, nLEDg, and nLEDb aligned between first and second electrodes 210 and 220.

In some embodiments, solution 300 may have an ink or paste phase. For example, solution 300 may be an ink including the bar-type LEDs nLEDr, nLEDg, or nLEDb. In this embodiment, an insulating material for forming an insulative support body may be mixed with the bar-type LEDs nLEDr, nLEDg, or nLEDb in the solution 300. For example, the bar-type LEDs nLEDr, nLEDg, or nLEDb and a positive type photoresist may be mixed in the solution 300. The insulating material in the solution 300, at least one of various organic/inorganic insulating materials, as well as the positive type photoresist, may be mixed with the bar-type LEDs nLEDr, nLEDg, or nLEDb.

When an insulating layer in which the bar-type LEDs nLEDr, nLEDg, or nLEDb and the insulating material are mixed together is coated (or dropped) onto each of the pixel regions, an insulating layer 230c may be formed at the same time when at least one bar-type LED nLEDr, nLEDg, or nLEDb is injected into each of the pixel regions. For example, in this embodiment, the process of injecting the bar-type LEDs nLEDr, nLEDg, and nLEDb and the process of forming the insulating layer 230c may be integrated. In some embodiments, after the bar-type LEDs nLEDr, nLEDg, and nLEDb are injected or at the same time when the bar-type LEDs nLEDr, nLEDg, and nLEDb are injected, a voltage may applied to the first and second electrodes 210 and 220, thereby self-aligning the bar-type LEDs nLEDr, nLEDg, and nLEDb.

Referring to FIG. 11B, an insulative support body 230 may be formed under the bar-type LEDs nLEDr, nLEDg, and nLEDb using the aligned bar-type LEDs nLEDr, nLEDg, and nLEDb as a mask. For example, through an etching process using the aligned bar-type LEDs nLEDr, nLEDg, and nLEDb as a mask, the insulating layer 230c under the bar-type LEDs nLEDr, nLEDg, and nLEDb may remain, and the insulating layer 230 over the first and second electrodes 210 and 220 and the bar-type LEDs nLEDr, nLEDg, and nLEDb may be removed, thereby forming the insulative support body 230 only under each of the bar-type LEDs nLEDr, nLEDg, and nLEDb (between the substrate 200 and the bar-type LEDs nLEDr, nLEDg, and nLEDb).

For example, when insulating layer 230c includes a positive-type photoresist, through a photo process using the bar-type LEDs nLEDr, nLEDg, and nLEDb as a mask, the insulating layer 230c under the bar-type LEDs nLEDr, nLEDg, and nLEDb may remain and the insulating layer 230 over the first and second electrodes 210 and 220 and the bar-type LEDs nLEDr, nLEDg, and nLEDb may be removed.

In addition to the photo process, through a front vertical etching process, etc., using the bar-type LEDs nLEDr, nLEDg, and nLEDb as a mask, the insulating layer 230c under the bar-type LEDs nLEDr, nLEDg, and nLEDb may remain, and the insulating layer 230 over the first and second electrodes 210 and 220 and the bar-type LEDs nLEDr, nLEDg, and nLEDb may be removed. The insulating layer 230c may be an organic layer and/or an inorganic layer.

As described above, the process of injecting the bar-type LEDs nLEDr, nLEDg, and nLEDb and the process of forming the insulating layer 230c are integrated, so that the insulative support body 230 may be formed through a relatively simple process.

Figure 12:
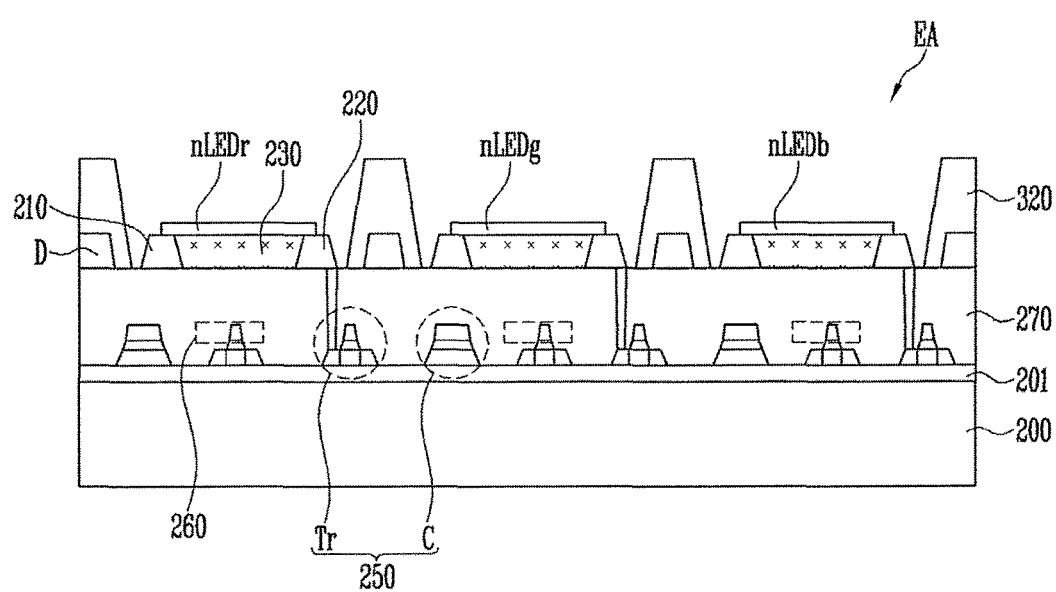
FIG. 12 illustrates another embodiment of a light emitting device.

FIG. 12 illustrates another embodiment of a light emitting device. Referring to FIG. 12, circuit elements 250 such as transistors Tr and capacitors C and an insulating layer 270 covering the circuit elements 250 may be further provided between a substrate 200 and bar-type LEDs nLEDr, nLEDg, and nLEDb. In some embodiments, a reflective layer 260 may be provided under each of the bar-type LEDs nLEDr, nLEDg, and nLEDb. For example, the reflective layer 260 may be configured by expanding the area of at least one electrode among electrodes of at least one transistor Tr and/or at least one capacitor C.

Examples of the transistors Tr and capacitors C are illustrated in FIG. 12. The shapes, structures, positions, and/or numbers of these elements may be different in other embodiments. For example, the circuit elements 250 of the pixel circuit 144 in FIG. 4A may be formed in each pixel region.

According to the present embodiment, the insulative support body is formed between the substrate 200 and the bar-type LED nLED. Accordingly, the bar-type LED nLED may be prevented from deviating from the position at which the bar-type LED nLED is aligned, after the process of aligning the bar-type LED nLED.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device, comprising:
a substrate;
first and second electrodes spaced apart from each other on the substrate;
at least one bar-type LED having a first end on the first electrode and a second end on the second electrode, the at least one bar-type LED having a length greater than a diameter;
an insulative body between the substrate and the bar-type LED;
an insulating film surrounding at least a part of an outer circumferential surface of the bar-type LED and exposing opposite side surfaces of the first and second ends; and
first and second contact electrodes respectively disposed on the first and second ends of the bar-type LED,
wherein the first contact electrode is in contact with an upper surface of the first electrode and the side surface of the first end, and the second contact electrode is in contact with an upper surface of the second electrode and the side surface of the second end, and
wherein at least one of the first and second contact electrodes contacts the insulating film.

2. The light emitting device of claim 1, wherein the bar-type LED has a cylindrical shape or polygonal column shape at a micro scale or nano scale.

3. The light emitting device of claim 1, wherein the bar-type LED includes a first conductive semiconductor layer doped with a first conductive dopant, a second conductive semiconductor layer doped with a second conductive dopant, and an active layer between the first and second conductive semiconductor layers.

4. The light emitting device of claim 1 wherein the insulative body has a width corresponding to the diameter or a width of the bar-type LED.

5. The light emitting device of claim 1, wherein a shortest length of the insulative body is substantially equal to a distance between the first and second electrodes.

6. The light emitting device of claim 1, wherein the first electrode, the second electrode, and the insulative body are on a same plane on the substrate and have substantially a same height.

7. The light emitting device of claim 1, wherein the insulative body includes at least one of one or more organic layers or one or more inorganic layers.

8. The light emitting device of claim 1, wherein the first and second contact electrodes respectively connect the first and second ends of the bar-type LED to the first and second electrodes.

9. The light emitting device of claim 8, wherein the first and second contact electrodes cover the first and second ends of the bar-type LED and one end of the first and second electrodes.

10. The light emitting device of claim 1, wherein the first and second electrodes are spaced apart from each other at a distance less than the length of the bar-type LED.

11. A light emitting display device, comprising:
a light emitting display panel including a substrate and a plurality of pixels on the substrate;
each of the plurality of pixels including:
first and second electrodes spaced apart from each other on the substrate;
at least one bar-type LED having a first end on the first electrode and a second end on the second electrode, the at least one bar-type LED having a length greater than a diameter;
an insulative body between the substrate and the bar-type;
an insulating film surrounding at least a part of an outer circumferential surface of the bar-type LED and exposing opposite side surfaces of the first and second ends; and
first and second contact electrodes respectively disposed on the first and second ends of the bar-type LED,
wherein the first contact electrode is in contact with an upper surface of the first electrode and the side surface of the first end, and the second contact electrode is in contact with an upper surface of the second electrode and the side surface of the second end, and
wherein at least one of the first and second contact electrodes contacts the insulating film.

12. The light emitting display device of claim 11, further comprising a partition wall between adjacent two pixels.

13. The light emitting display device of claim 12, wherein the adjacent two pixels emit light of different colors.

14. The light emitting display device of claim 11, wherein:
each of the plurality of pixels further includes:
a transistor between the substrate and the first and second electrodes; and
an insulating layer disposed between the transistor and the first and second electrodes, and
one of the first and second electrodes is electrically connected to the transistor.

15. The light emitting display device of claim 11, wherein each of the plurality of pixels includes a plurality of bar-type LEDs.

16. The light emitting display device of claim 11, wherein the first contact electrode partially covers the first electrode.

* * * * *